United States Patent
Yoon

(10) Patent No.: US 7,326,959 B2
(45) Date of Patent: Feb. 5, 2008

(54) THIN FILM TRANSISTOR WITH COMMON CONTACT HOLE AND FABRICATION METHOD THEREOF

(75) Inventor: Han-Hee Yoon, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/129,393

(22) Filed: May 16, 2005

(65) Prior Publication Data

US 2005/0258486 A1    Nov. 24, 2005

(30) Foreign Application Priority Data

May 24, 2004    (KR)    ........................ 10-2004-0036841

(51) Int. Cl.
  *H01L 29/76*    (2006.01)
(52) U.S. Cl. .................. 257/66; 257/E21.412; 438/151
(58) Field of Classification Search ................ 257/59, 257/66, E21.412; 438/151
See application file for complete search history.

(56) References Cited

U.S. PATENT DOCUMENTS

| | | | | |
|---|---|---|---|---|
| 5,696,388 | A * | 12/1997 | Funada et al. ................ | 257/64 |
| 5,789,762 | A * | 8/1998 | Koyama et al. .............. | 257/66 |
| 5,923,961 | A * | 7/1999 | Shibuya et al. ............. | 438/149 |
| 6,004,831 | A * | 12/1999 | Yamazaki et al. ............ | 438/30 |
| 2001/0049163 | A1 * | 12/2001 | Yamazaki et al. .......... | 438/158 |

FOREIGN PATENT DOCUMENTS

| | | |
|---|---|---|
| JP | 61-201460 | 9/1986 |
| JP | 04-359562 | 12/1992 |
| JP | 07-056189 | 3/1995 |
| JP | 08-125028 | 5/1996 |
| JP | 2003-030995 | 1/2003 |

OTHER PUBLICATIONS

Brotherton et al., "Excimer-laser-annealed poly-Si thin-film transistors,"IEEE Transacions on Electron Devices, vol. 40, Issue 2, Feb. 1993 pp. 407-413.*

Lee et al., "Lateral diffusion of phosphorous ions by excimer laser annealing in the poly-Si film on silicon dioxide film," IEEE Student Paper Publication, http://ieeexplore.ieee.org.iel5/8974/28477/01272094.pdf?arnumber=1272094.*

* cited by examiner

*Primary Examiner*—Thomas L. Dickey
(74) *Attorney, Agent, or Firm*—H.C. Park & Associates, PLC

(57) ABSTRACT

The present invention provides a TFT substrate that includes a plurality of TFTs each of which have a gate, a source and a drain. The plurality of the TFTs may be formed by first and second active regions formed on the substrate that each have a source region that corresponds to a source and a drain region that corresponds to a drain. An offset region may be formed between the first and second active regions. A single contact hole may reach both the offset region and the adjacent source/drain regions of the first and second active regions.

18 Claims, 4 Drawing Sheets

THIN FILM TRANSISTOR WITH COMMON CONTACT HOLE AND FABRICATION METHOD THEREOF

CROSS-REFERENCE TO RELATED APPLICATIONS

This application claims priority to and the benefit of Korean Patent Application No. 10-2004-0036841 filed on May 24, 2004 in the Korean Intellectual Property Office, the content of which is herein incorporated by reference in its entirety.

BACKGROUND OF THE INVENTION

1. Field of the Invention

The present invention relates generally to a thin film transistor (TFT) substrate and a fabrication method thereof and more specifically, to a TFT substrate applicable to an organic light-emitting diode (OLED) display and also relates to a fabrication method of such a TFT substrate.

2. Description of the Related Art

The organic light-emitting diode (OLED) display is regarded as an advanced display because of its fast responsiveness, low power consumption, and wide view angles. The OLED display is expected to be a next-generation display that will replace the cathode ray tube (CRT) display.

An OLED display electrically excites organic components sandwiched between a pair of electrodes, and creates visual images by voltage-programming or current-programming N×M number of organic light-emitting pixels.

Methods of driving the organic light-emitting pixels include a passive matrix method and an active matrix method, the active matrix method employing a TFT. In the passive matrix method, an anode electrode and a cathode electrode are formed crossing each other, and lines are selected to drive the organic light emitting pixels. However, in the active matrix method, a TFT and a capacitor is coupled to each pixel electrode, and the light emitting pixel is driven in accordance with a voltage maintained by capacitance of the capacitor coupled to the TFT.

A typical OLED display for an active matrix method includes a display panel, a data driver, and a scan driver.

The display panel includes a plurality of data lines extending in a row direction, a plurality of scan lines extending in a column direction, and a plurality of pixel circuits. The plurality of data lines transmit data signals for an image to the pixel circuits, and the plurality of scan lines transmit selection signals to the pixel circuits, respectively. Typically, the pixel circuit includes a switching transistor, a driving transistor, a capacitor, and an OLED, and is formed at a pixel area where a data line and a scan line cross each other.

In response to the selection signal from the scan line, the switching transistor transmits a data voltage received from the data line to the driving transistor. The driving transistor determines a driving current using a data voltage applied to a gate thereof and a source voltage applied to a source thereof, and applies the determined driving current to the OLED. The capacitor maintains a gate-source voltage of the driving transistor for a predetermined time period, and the OLED emits a light corresponding to a current applied through the driving transistor.

The scan driver sequentially applies the selection signal to the scan lines, and the data driver sequentially applies a data voltage corresponding to the image signal to the plurality of data lines.

An OLED display of a system-on-panel (SOP) scheme, in which a display panel, a scan driver, and data driver are integrally formed as a single panel, is currently under serious study.

In an OLED display of the SOP scheme, peripheral circuits (such as a data driver and/or a scan driver) as well as pixel circuits are formed on the same panel. Therefore, TFTs for the pixel circuits and the peripheral circuits are formed on the panel, and the panel formed with the TFTs is called a TFT substrate.

FIG. 1 is a vertical cross-section of a conventional TFT substrate, and illustrates both an NMOS transistor and a PMOS transistor formed to provide a CMOS structure.

Conventionally, when both an NMOS transistor and a PMOS transistor are formed on a silicon substrate, a source/drain region $513a'$ of the NMOS transistor and a source/drain region $513b'$ of the PMOS transistor are firstly patterned, and then contact holes $519a$ and $519b$ are formed. That is, elements of the NMOS and PMOS transistors are separated by a gate insulation layer 514 and an interlayer insulating layer 518 and the contact holes $519a$ and $519b$ are respectively formed on the source/drain regions $513a'$ and $513b'$, respectively. In such a CMOS structure, the contact holes $519a$ and $519b$ are formed on each of the source/drain regions $513a'$ and $513b'$ consume excessive space in a layout design, thereby causing a deterioration of the integration level.

SUMMARY OF THE INVENTION

The present invention provides a TFT substrate having a common contact hole formed between adjacent source/drain regions of neighboring TFTs. Use of the common contact hole reduces the number of contacts in the TFT substrate. Additionally the present invention further provides a TFT substrate and lower manufacturing costs. The present invention also provides a method of fabricating the common contact hole and the TFT substrate having an offset interval that is formed between adjacent active regions of TFTs during the formation of the TFTs. The offset interval prevents the TFT substrate from malfunctioning.

An exemplary TFT substrate according to an embodiment of the present invention includes a plurality of adjacent transistors each of which has a gate, a source and a drain. The TFT substrate includes a substrate, first and second active regions formed on the substrate and respectively having a source region corresponding to a source electrode and a drain region corresponding to a drain electrode. An offset region may be formed between the first and second active regions. A single contact hole may reach both the offset region and adjacent source/drain regions of neighboring TFTs.

Another exemplary TFT substrate of the present invention includes a plurality of TFTs each of which has a gate, a source, and a drain. The TFT substrate includes a substrate, first and second active regions, an offset region, a gate insulating layer, first and second gate materials, and a single contact hole. The first active region may be formed by doping a first impurity to a polysilicon layer on the substrate so as to include source/drain regions corresponding to the source or the drain. The second active region may be formed by doping a second impurity to the polysilicon layer on the substrate so as to include source/drain regions corresponding to the source or the drain. The offset region may be formed between the first and second active regions. The gate insulating layer may be formed over the first and second active regions. The first and second gate materials are respectively formed, on the gate insulating layer, in the first and second active regions. The single contact hole is formed on both of the offset region and the adjacent source/drain regions of the first and second active regions so as to connect the adjacent sources/drain regions of the first and second active regions.

An exemplary method for fabricating a TFT substrate includes forming first and second active regions on a substrate that have source/drain regions corresponding to a source or a drain, doping the source/drain regions of the first and second active regions with different types of impurities, forming an offset region between adjacent source/drain regions of the first and second active regions, forming a single contact hole on both of the offset region and the adjacent source/drain regions of the first and second active regions, and connecting the adjacent source/drain regions of the first and second active regions through the single contact hole.

In another further embodiment, the doping of the source/drain regions includes forming a gate insulating layer in the first and second active regions, doping different high-concentration impurities to the first and second active regions from above of the gate insulating layer, and doping different low-concentration impurities to the source/drain regions of the first and second active regions so as to form lightly doped drain regions.

An exemplary flat panel display according to an embodiment of the present invention includes a display panel, a scan driver for applying selections signals to the display panel, and a data driver for applying data signals to the display panel. At least one of the display panel, the scan driver, and the data driver includes a substrate, first and second active regions formed on the substrate and respectively having a source/drain region corresponding to the source or the drain, an offset region formed between the first and second active regions, and a contact hole reaching both of the offset region and the adjacent source/drain regions of the first and second active regions.

BRIEF DESCRIPTION OF THE DRAWINGS

The accompanying drawings, which are included to provide a further understanding of the invention are incorporated in and constitute part of this specification, illustrate embodiments of the invention and together with the description serve to explain the principles of the invention.

DETAILED DESCRIPTION OF THE EXEMPLARY EMBODIMENTS

Hereinafter, a TFT substrate for a light-emitting display and a fabrication method thereof according to an embodiment of the present invention will be described in detail with reference to the accompanying drawings.

Figure 1:
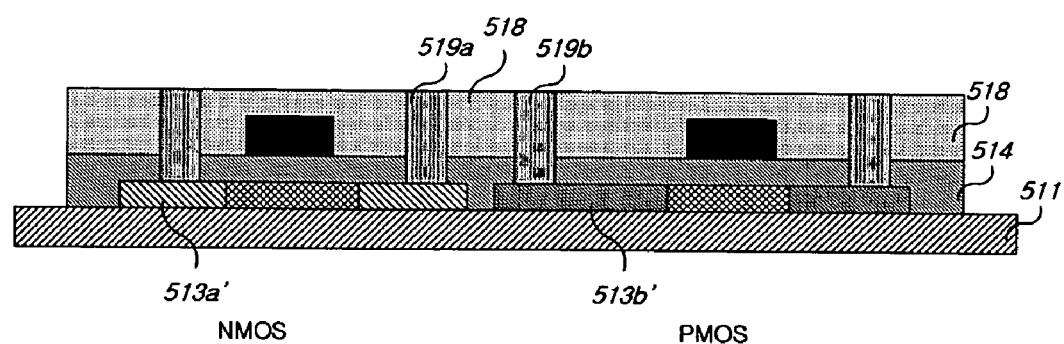
FIG. 1 is a vertical cross-section of a conventional TFT substrate.
Figure 2:
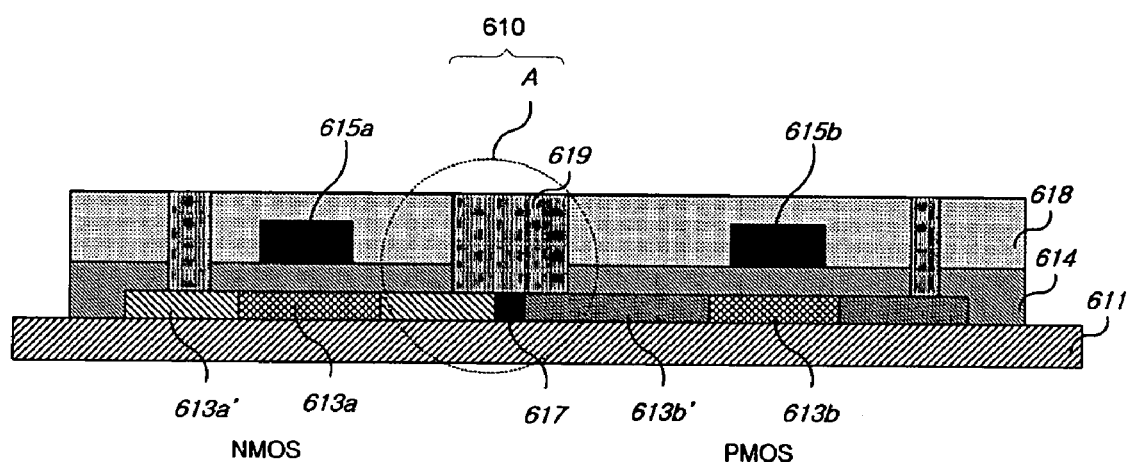
FIG. 2 is a vertical cross-section of a TFT substrate according to an embodiment of the present invention.

FIG. 2 is a vertical cross-section of a TFT substrate for a light-emitting display according to an embodiment of the present invention. The TFT substrate for a light-emitting display according to an embodiment of the present invention includes a plurality of TFTs each of which has a gate, a source, and a drain. In more detail, such a TFT substrate includes a silicon dioxide layer 611 deposited as a buffer layer on a substrate (not shown). A first active region and a second active region are formed on the silicon dioxide layer 611. Each has a gate region that corresponds to a gate electrode, a source region that corresponds to a source electrode, and a drain region that corresponds to a drain electrode. In one embodiment, the drain region of a first TFT may abut a source region of a second adjacent TFT. A contact hole 610 may be formed in common on adjacent source/drain regions of the first and second active regions. A conductive material 619 may fill the contact hole 610. An offset region 617 may be formed between the adjacent source/drain regions of the first and second active regions. The contact hole 610 reaches both the offset region 617 and the above-mentioned adjacent source/drain regions. Here, the first active region and the second active region may have a CMOS structure, wherein one of the active regions is a PMOS region and the other is an NMOS region.

In the area denoted by a symbol A, the offset region 617 is preferably at least 0.5 µm in length to prevent diffusion of the doped regions. The offset region 617 is a polysilicon layer formed from an amorphous silicon layer by dehydrogenation and crystallization. Such an offset region 617 may be formed by being masked with a mask while the polysilicon layer is doped with N- and P-type impurities.

Reference numerals 613a and 613a' respectively denote undoped and doped regions of a polysilicon layer in the NMOS region. However, it is noted that the region 613a may also be doped. Reference numerals 613b and 613b' respectively denote undoped and doped regions of a polysilicon layer in the PMOS region. However, it is noted that the region 613b may also be doped.

The region 613a' may be coupled to a source electrode and the region 613b' may be coupled to a drain electrode. Each region may be doped with different impurities.

In addition, the regions 613a and 613b are channel regions, and they may be doped with impurities or undoped depending on a desired embodiment.

Reference numeral 614 denotes a gate insulating layer formed on the first active region and in the second active region.

The TFT shown in FIG. 2 is hereinafter described in detail with reference to a method for fabricating a TFT for a light-emitting display according to an embodiment of the present invention.

FIGS. 3A to 3K illustrate one such method. It will be appreciated that the following method steps may be performed in any suitable order.

Figure 3A:
FIG. 3A, FIG. 3B, FIG. 3C, FIG. 3D, FIG. 3E, FIG. 3F, FIG. 3G, FIG. 3H, FIG. 3I, FIG. 3J and FIG. 3K are illustrations showing a process for fabricating a TFT substrate according to an embodiment of the present invention.
Figure 3B:
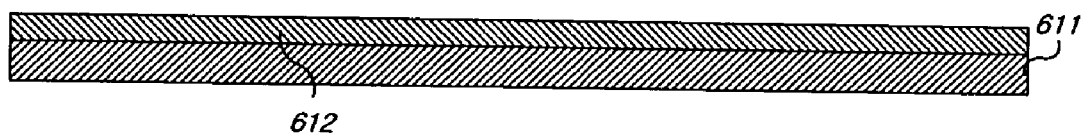

To begin, the silicon dioxide layer 611 may be deposited as a buffer layer on a silicon substrate or a glass substrate as shown in FIG. 3A. Subsequently, a hydrogenated amorphous silicon (a-Si:H) layer may be deposited by plasma enhanced chemical vapor deposition (PECVD) as shown in FIG. 3B.

Figure 3C:
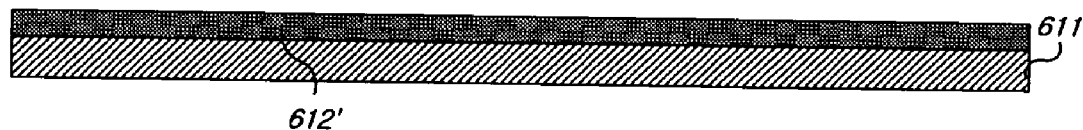
Figure 3D:
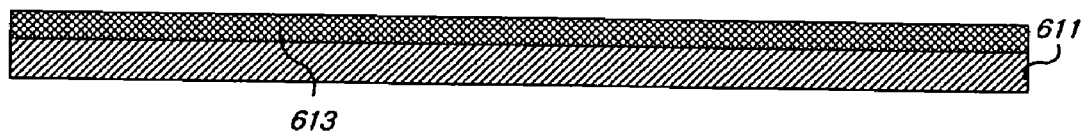

The hydrogenation amorphous silicon layer may be dehydrogenated as shown in FIG. 3C and crystallized by excimer laser annealing (ELA) as shown in FIG. 3D.

More specifically, a polysilicon TFT may be formed on the silicon dioxide layer 611 deposited on the silicon substrate, by depositing an amorphous silicon (a-Si) thin film 612 on the substrate by PECVD at a low temperature of less than 400° C. The thin film 612 may be subjected to dehydrogenation before its crystallization because it gathers a lot of hydrogen (H) (about 10%) in the deposition of the a-Si thin film 612 by PECVD. For crystallization of the dehydrogenated a-Si thin film 612' into a polysilicon film 613, an excimer laser beam is irradiated thereto.

Figure 3E:
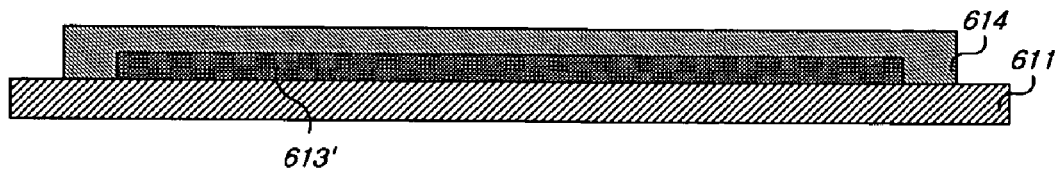
Figure 3F:
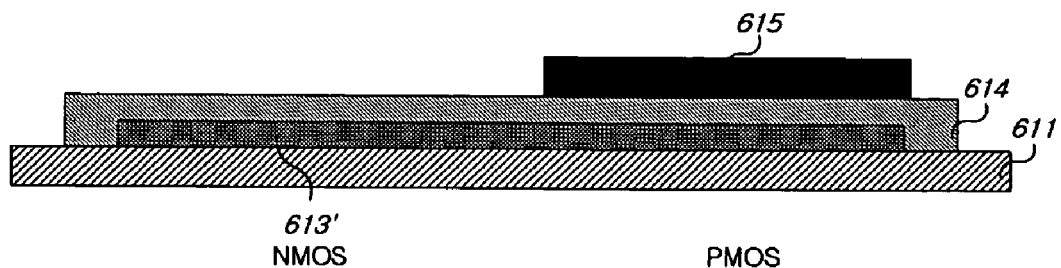

The crystallized polysilicon film 613 may be patterned by using a first mask and then etched by dry etching so as to form an active region 613'. $SiO_2$ may be deposited by PECVD on the entire surface of the silicon dioxide layer 611 so as to form the gate insulating layer 614 (FIG. 3E). That is, the polysilicon film 613 may be formed as an active region by photolithography and etching.

Figure 3G:
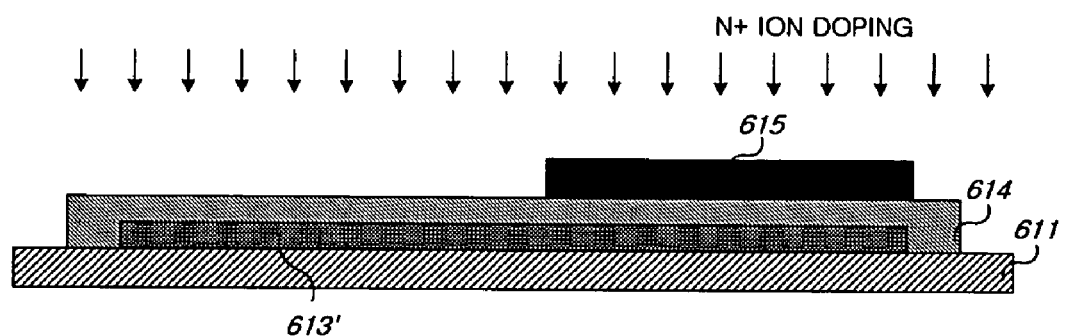

Each active region may be divided into NMOS and PMOS active regions using the following or equivalent process. A photoresist 615 is formed as a second mask in a PMOS active region by photolithography (FIG. 3F), and high-concentration impurities are implanted through the gate insulating layer 614 in an NMOS active region (FIG. 3G). That is, N+ impurities may be doped from above the insulating layer 614 of the NMOS active region.

Figure 3H:
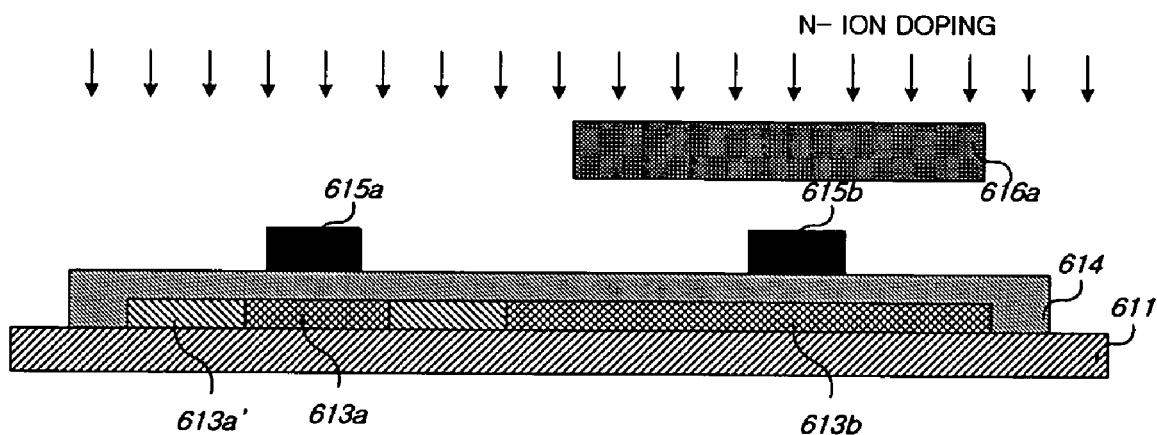

Subsequently, gate electrode 615a (e.g., comprised of a metal) is formed in the NMOS region and gate electrode 615b is formed in the PMOS region. N– impurities may be implanted into the source/drain region of the NMOS active region (FIG. 3H). Reference numeral 613a' denotes a region of the polysilicon layer implanted with low-concentration N– impurities, and reference numeral 613a denotes a region undoped with low-concentration N– impurities under a gate 615a. In this manner, high-concentration N+ impurities and low-concentration N– impurities may be implanted to form a lightly doped drain (LDD).

On the other hand, the PMOS active region may be formed by doping/implanting P+ and P– impurities in the same manner as described above in connection with the NMOS active region. Here, reference numeral 616a denotes a mask of a photoresist.

Figure 3I:
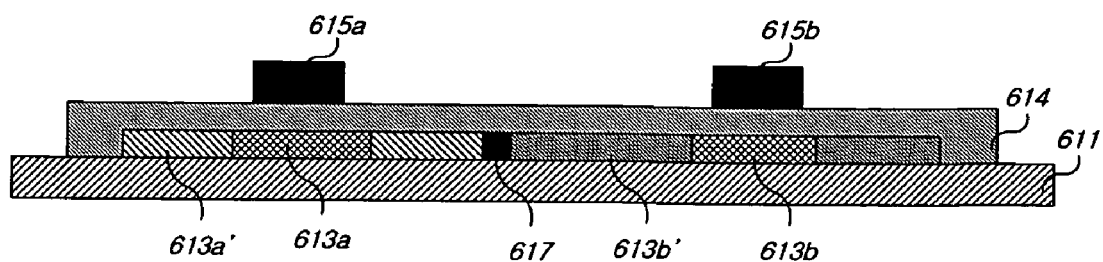

Subsequently, an ELA or a heat treatment in a furnace may be performed for activation such that the offset region 617 is formed between the adjacent source/drain regions (FIG. 3I). That is, the offset region 617 may be formed since the photoresist mask is designed to provide an offset of about 0.5 μm in the P-doped region and the N-doped region in consideration of diffusion of the doped regions.

Figure 3J:
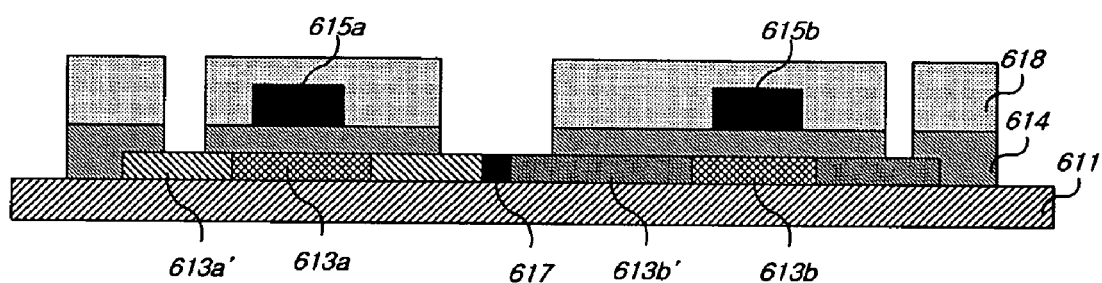

An interlayer 618 may be deposited as an insulating layer on the entire exposed surface, and a contact hole may be formed in the source/drain region of the NMOS and PMOS active regions by lithography and etching (FIG. 3J). Preferably, one contact hole is formed in common in the adjacent regions of the NMOS and PMOS active regions. This couples adjacent source/drain regions of the NMOS and PMOS active regions, and accordingly, the number of contacts may be reduced.

Figure 3K:
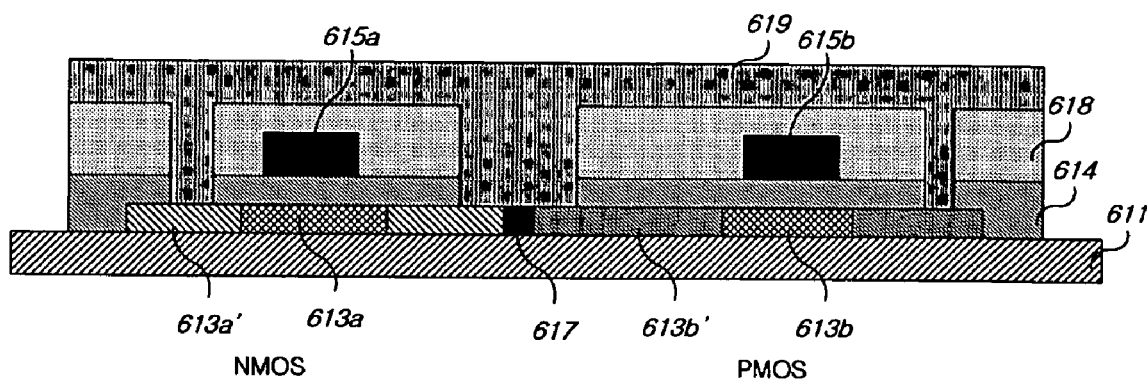

Subsequently, the conductive material 619 fills the contact hole formed on the source/drain region of the NMOS and PMOS active regions (FIG. 3K). Here, Mo/AlNd/Mo may be filled as the conductive material 619 in the contact hole.

Finally, parts of the conductive material that overflow the contact hole may be eliminated by planarization, and a TFT substrate may be completed by subsequent conventional fabrication processes known to persons of ordinary skill in the art.

As described above, according to an embodiment of the present invention, an offset interval of about 0.5 μm in consideration of diffusion of the doped regions may be formed between adjacent active regions of TFTs, during formation of TFTs on a panel. This reduces the number of required contacts and prevents the TFT from malfunctioning.

Hereinafter, a flat panel display according to an embodiment of the present invention will be described in detail.

A flat panel display according to an embodiment of the present invention includes a display panel, a scan driver for applying selection signals to the display panel, and a data driver for applying data signals to the display panel. The flat panel display according to an embodiment of the present invention is preferably an OLED display, however, the present invention is limited to a specific type of the flat panel display.

Each of the display panel, the scan driver and the data driver of the flat panel display according to an embodiment of the present invention may be fabricated using a TFT substrate according to an embodiment of the present invention described above.

While this invention has been described in connection with what is presently considered to be the most practical and exemplary embodiment, it is to be understood that the invention is not limited to the disclosed embodiments, but, on the contrary, is intended to cover various modifications and equivalent arrangements included within the spirit and scope of the appended claims.

What is claimed is:

1. A thin film transistor substrate including a plurality of thin film transistors each transistor having a gate, a source, and a drain, the thin film transistor substrate comprising:
   a substrate;
   a first active region and second active region formed on the substrate and respectively having a source/drain region;
   an undoped offset region formed only between the first active region and the second active region; and
   a contact hole exposing the offset region and adjacent source/drain regions of the first active region and the second active region.

2. The thin film transistor substrate of claim 1, wherein the offset region is formed between the adjacent source/drain regions of the first active region and the second active region.

3. The thin film transistor substrate of claim 1, wherein the offset region has a dimension of at least 0.5 μm in length.

4. The thin film transistor substrate of claim 1, wherein the offset region is a polysilicon layer comprised of an amorphous silicon layer crystallized after dehydrogenation.

5. A thin film transistor substrate including a plurality of thin film transistors each having a gate, a source, and a drain, the thin film transistor substrate comprising:
   a substrate; a first active region formed by doping a first impurity to a polysilicon layer on the substrate so as to include source/drain regions;
   a second active region formed by doping a second impurity to the polysilicon layer on the substrate so as to include source/drain regions;
   an undoped offset region formed only between the first active region and the second active region;
   a gate insulating layer formed over the first active region and the second active region;
   a first gate electrode and a second gate electrode respectively formed, on the gate insulating layer, above the first active region and the second active region; and
   a single contact hole exposing the offset region and adjacent source/drain regions of the first active region and the second active region.

6. The thin film transistor substrate of claim 5, wherein the offset region is formed between the adjacent source/drain regions of the first active region and the second active region.

7. The thin film transistor substrate of claim 5, wherein one of the first and second impurities is a P-type impurity when the other is an N-type impurity.

8. The thin film transistor substrate of claim 5, wherein the source/drain regions comprises a lightly doped drain region.

9. The thin film transistor substrate of claim 5, wherein the polysilicon layer comprises an amorphous silicon layer crystallized by excimer laser annealing after dehydrogenation.

10. A method for fabricating a thin film transistor substrate, comprising:
   forming a first active region and a second active region on a substrate, each of the first active region and the second active region including source/drain regions;
   doping the source/drain regions of the first active region and the second active region with different types of impurities;
   forming an undoped offset region only between adjacent source/drain regions of the first active region and the second active region;
   forming a single contact hole exposing the offset region and the adjacent source/drain regions of the first active region and the second active region; and
   coupling the adjacent source/drain regions of the first active region and the second active region through the single contact hole.

11. The method as claimed in claim 10, wherein one of the first and second active regions is a PMOS region and the other is an NMOS region.

12. The method as claimed in claim 10, wherein the doping of the source/drain regions comprises:
   forming a gate insulating layer on the first active region and the second active region;
   doping different high-concentration impurities to the first active region and the second active region; and
   doping different low-concentration impurities to the first active region and the second active region so as to form lightly doped drain regions.

13. The method as claimed in claim 10, wherein forming the offset region includes masking the offset region during the doping of the source/drain regions.

14. The method as claimed in claim 10, wherein the offset region has a dimension of at least about 0.5 µm in length.

15. The method as claimed in claim 10, wherein a conductive material fills the contact hole so as to couple the adjacent source/drain regions.

16. A flat panel display comprising a display panel, a scan driver for applying selections signals to the display panel, and a data driver for applying data signals to the display panel, wherein at least one of the display panel, the scan driver, and the data driver comprises:
   a substrate;
   a first active region and a second active region formed on the substrate, each of the first active region and the second active region having a source/drain region;
   an undoped offset region formed only between the first active region and the second active region; and
   a contact hole exposing the offset region and adjacent source/drain regions of the first active region and the second active region.

17. The flat panel display of claim 16, wherein the offset region is formed between the adjacent source/drain regions of the first active region and the second active region.

18. The flat panel display of claim 16, wherein one of the first and second active regions is a PMOS region and the other is an NMOS region.

* * * * *